United States Patent
Shin et al.

(10) Patent No.: US 7,245,106 B2
(45) Date of Patent: Jul. 17, 2007

(54) CONTROLLER OF PULSE WIDTH MODULATION SIGNAL-DRIVEN DEVICE, AND METHOD OF REDUCING NOISE OF THE DEVICE

(75) Inventors: Kentaro Shin, Yokohama (JP); Yasuaki Hayami, Yokosuka (JP); Kraisorn Throngnumchai, Yokohama (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 0 days.

(21) Appl. No.: 11/266,168

(22) Filed: Nov. 4, 2005

(65) Prior Publication Data
US 2006/0097685 A1  May 11, 2006

(30) Foreign Application Priority Data
Nov. 8, 2004  (JP) ............................. 2004-323085

(51) Int. Cl.
*H02P 8/12* (2006.01)
*H02P 7/06* (2006.01)
*H02P 7/29* (2006.01)

(52) U.S. Cl. ...................... 318/811; 318/685; 318/599; 388/804; 388/811; 388/819; 388/912

(58) Field of Classification Search ...................... None
See application file for complete search history.

(56) References Cited

U.S. PATENT DOCUMENTS 3,683,254 A * 8/1972 Michel et al. .............. 318/608
4,494,051 A * 1/1985 Bailey ......................... 318/254
6,243,635 B1 * 6/2001 Swan et al. ................... 701/49
6,812,667 B2 * 11/2004 Yasohara et al. ........... 318/599
2005/0140330 A1    6/2005 Throngnumchai

FOREIGN PATENT DOCUMENTS

| JP | 04109900 A | * | 4/1992 |
| JP | 7-099795 A | | 4/1995 |
| JP | 07099795 A | * | 4/1995 |

* cited by examiner

*Primary Examiner*—Lincoln Donovan
*Assistant Examiner*—Eduardo Colon Santana
(74) *Attorney, Agent, or Firm*—Foley & Lardner LLP

(57) ABSTRACT

A controller of a pulse width modulation signal-driven device, includes: an instruction input of operating the pulse width modulation signal-driven device; a control section generating a control clock which operates the pulse width modulation signal-driven device; a frequency modulator frequency-modulating the control clock, to thereby give to the control clock a frequency variation in a predetermined frequency range; a frequency varier generating a modulation signal inputted to the frequency modulator; and a first switching member driving the switching element which flows a predetermined drive current to the pulse width modulation signal-driven device based on the frequency-modulated control clock. The frequency varier includes: a first signal generator setting a range of diffusing a switching noise in a frequency range, and a unit for shifting a frequency band of the switching noise by giving a predetermined offset voltage to an output voltage of the first signal generator.

7 Claims, 14 Drawing Sheets

CONTROLLER OF PULSE WIDTH MODULATION SIGNAL-DRIVEN DEVICE, AND METHOD OF REDUCING NOISE OF THE DEVICE

BACKGROUND OF THE INVENTION

1. Field of the Invention

The present invention relates to a controller for controlling operation of a pulse width modulation signal-driven device and a method of reducing unnecessary noise spectrum component of the signal-driven device.

A device driven with a pulse width modulation signal (for example, a current controlled-stepping motor) is so structured that operation of the above device is controlled by varying duty ratio of waveform of a current flowing in the above device, namely, pulse width modulation (hereinafter referred to as "PWM"). Switching a drive current of a load at PWM pulse trains, the above PWM signal-driven device causes a switching noise of a reference control frequency and of a high harmonic (of the reference control frequency). The thus caused switching noise is inconvenient. In a vehicle, for example, the switching noise may influence hearing of an on-vehicle radio or on operation of other digital devices.

2. Description of the Related Art

Japanese Patent Unexamined Publication No. 1998-99795 (JP7099795) discloses a controlling device for stepping motor (referred to as "control device 5"), where a method of reducing noise spectrum component is shown. In JP7099795, for controlling a current controlled-stepping motor, a sinusoidal wave frequency modulation is applied to a PWM drive current pulse train (hereinafter, as the case may be, referred to as "control clock"), where the sinusoidal wave has a frequency lower than that of the control clock. With this, a noise spectrum component is diffused in a desired frequency band, thereby deceasing influence on the on-vehicle radio or other digital devices.

The above noise-reducing method according to the related art is, however, not necessarily sufficient for decreasing the influence on radio hearing, for the following reason. As a communication device, for example, the AM broadcasting in Japan uses frequency band of 545 kHz to 1,605 kHz, where multiples of 9 kHz are distributed to a broadcasting carrier wave of each office. In addition, about ±6 kHz of the broadcasting carrier wave is a side band wave, namely, about 12 kHz is a band width of one broadcasting carrier wave. Specifically, Nippon Broadcasting System, Inc. capable of receiving communications in and around Tokyo has a broadcasting carrier wave of 1,242 kHz, or 1,236 kHz to 1,248 kHz including the side band wave.

Herein, a controller of a stepping motor having a control clock frequency of 248 kHz is to be taken for example, so as to check for a possible influence on radio hearing by a noise of the control clock frequency and of the high harmonic (of the control clock frequency). In this case, the control clock has its five-multiple high harmonic frequency of 1,240 kHz (=248 kHz×5). This 1,240 kHz falls within the broadcasting carrier wave of Nippon Broadcasting System, Inc., (1,236 kHz to 1,248 kHz) including the side band wave, and therefore, this high harmonic component enters the radio's voice output as a noise, causing a harmful effect on the radio hearing of the broadcasting office. When a peak of a noise spectrum attributable to the control clock (and even if this control clock is out of the side band wave) is diffused by the method according to the related art, the thus diffused noise spectrum component is included in the broadcasting band, thus increasing influence on the radio hearing. As described the above, diffusing the spectrum of the switching noise of the control clock of the PWM signal-driven device in a frequency range may fail to sufficiently decrease influence on the radio receiving and on operation of other on-vehicle devices.

SUMMARY OF THE INVENTION

It is an object of the present invention to provide a controller for controlling operation of a pulse width modulation signal-driven device and a method of reducing noise of the signal-driven device.

When an emission spectrum becoming a noise spectrum component of a reference control frequency and of a high harmonic (of the reference control frequency) is diffused, the above controller forming a blank not including the noise spectrum component in the thus diffused spectrum can suppress the unnecessary noise described above.

According to a first aspect of the present invention, there is provided a controller of a pulse width modulation signal-driven device, comprising: 1) an instruction input for inputting an instruction of operating the pulse width modulation signal-driven device; 2) a control section for generating, with the instruction from the instruction input, a control clock which operates the pulse width modulation signal-driven device; 3) a frequency modulator for frequency-modulating the control clock which is an output of the control section, to thereby give to the control clock a frequency variation in a predetermined frequency range; 4) a frequency varier for generating a modulation signal to be inputted to the frequency modulator, the frequency varier including: i) a first signal generator for setting a range of diffusing a switching noise in a frequency range, the switching noise being caused by a switching element, and ii) a unit for shifting a frequency band of the switching noise by giving a predetermined offset voltage to an output voltage of the first signal generator; and 5) a first switching member for driving the switching element which flows a predetermined drive current to the pulse width modulation signal-driven device based on the frequency-modulated control clock.

According to a second aspect of the present invention, there is provided a method of controlling a pulse width modulation signal-driven device, comprising: 1) inputting an instruction of operating the pulse width modulation signal-driven device; 2) generating, with the thus inputted instruction, a control clock which operates the pulse width modulation signal-driven device; 3) frequency-modulating the thus generated control clock, to thereby give to the control clock a frequency variation in a predetermined frequency range; 4) generating a modulation signal to be inputted to a frequency modulator for the frequency-modulating, the generating of the modulation signal including: i) a first signal generating for setting a range of diffusing a switching noise in a frequency range, the switching noise being caused by a switching element, and ii) shifting a frequency band of the switching noise by giving a predetermined offset voltage to an output voltage generated by the first signal generating; and 5) driving the switching element which flows a predetermined drive current to the pulse width modulation signal-driven device based on the frequency-modulated control clock.

According to a third aspect of the present invention, there is provided a controller of a pulse width modulation signal-driven device, comprising: 1) inputting means for inputting an instruction of operating the pulse width modulation signal-driven device; 2) controlling means for generating, with the instruction from the instructing means, a control clock which operates the pulse width modulation signal-driven device; 3) frequency-modulating means for frequency-modulating the control clock from the controlling means, to thereby give to the control clock a frequency variation in a predetermined frequency range; 4) frequency-varying means for generating a modulation signal to be inputted to the frequency-modulating means, the frequency-varying means including: i) first signal generating means for setting a range of diffusing a switching noise in a frequency range, the switching noise being caused by a switching element, and ii) shifting means for shifting a frequency band of the switching noise by giving a predetermined offset voltage to an output voltage of the first signal generating means; and 5) first switching means for driving the switching element which flows a predetermined drive current to the pulse width modulation signal-driven device based on the frequency-modulated control clock.

The other object(s) and feature(s) of the present invention will become understood from the following description with reference to the accompanying drawings.

DESCRIPTION OF THE PREFERRED EMBODIMENTS

In the following, various embodiments of the present invention will be described in detail with reference to the accompanying drawings.

A current controlled-stepping motor is to be described as an example of a PWM signal-driven device.

(General Current Controlled-Stepping Motor)

Figure 1:
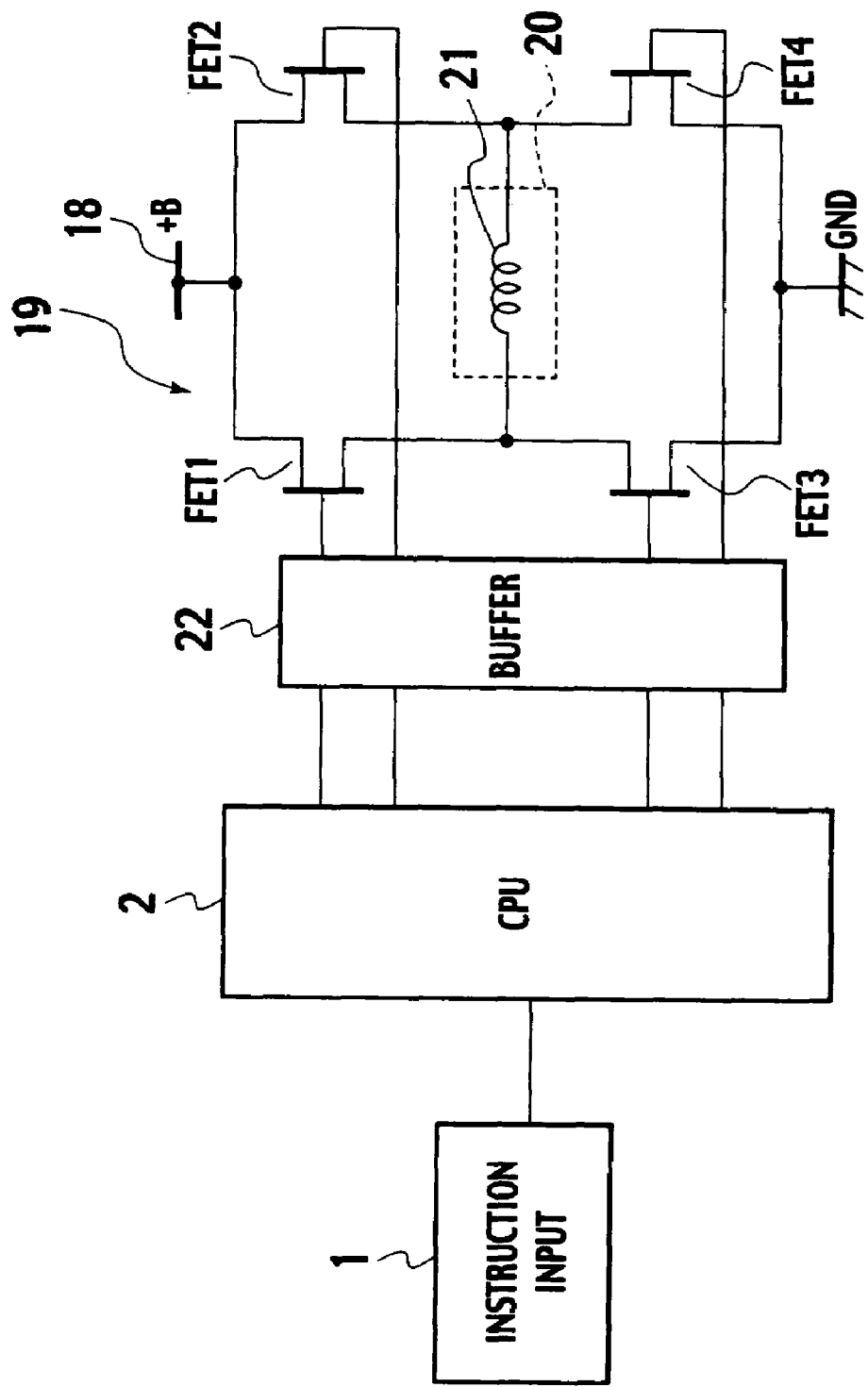
FIG. 1 shows a structure of a control system of a general current controlled-stepping motor.

FIG. 1 shows a structure of a control system of a general current controlled-stepping motor 20 (hereinafter referred to as "stepping motor 20"). In FIG. 1, a control instruction for the stepping motor 20 inputted from an instruction input 1 is inputted to a CPU 2, to thereby generate a PWM waveform-control clock for driving the stepping motor 20. In combination with sequence information sequentially supplying the control clock to a driving coil 21 of each phase of the stepping motor 20 according to a phase switching signal, the control clock is inputted via a buffer 22 to switching elements (FET1 to FET4) connected in a form of a bridge circuit, to thereby control an operation of the stepping motor 20.

In the structure in FIG. 1, i) the frequency of the control clock for driving the stepping motor 20 and ii) the sequence information which are thus inputted, in combination, to the switching elements (FET1 to FET4) control the stepping motor 20. Herein, by turning ON and OFF the current (flowing in the driving coil 21 of the stepping motor 20) using the PWM waveform-control clock, the switching elements (FET1 to FET4) control the above current. A power switching implemented by the switching elements (FET1 to FET4) emits a switching noise which has a PWM-waveform reference control frequency and a high harmonic component (of the PWM-waveform control clock), thus causing an influence on hearing of an on-vehicle radio. Hereinabove, FIG. 1 shows only one phase of the driving coil 21 of the stepping motor 20.

Figure 2:
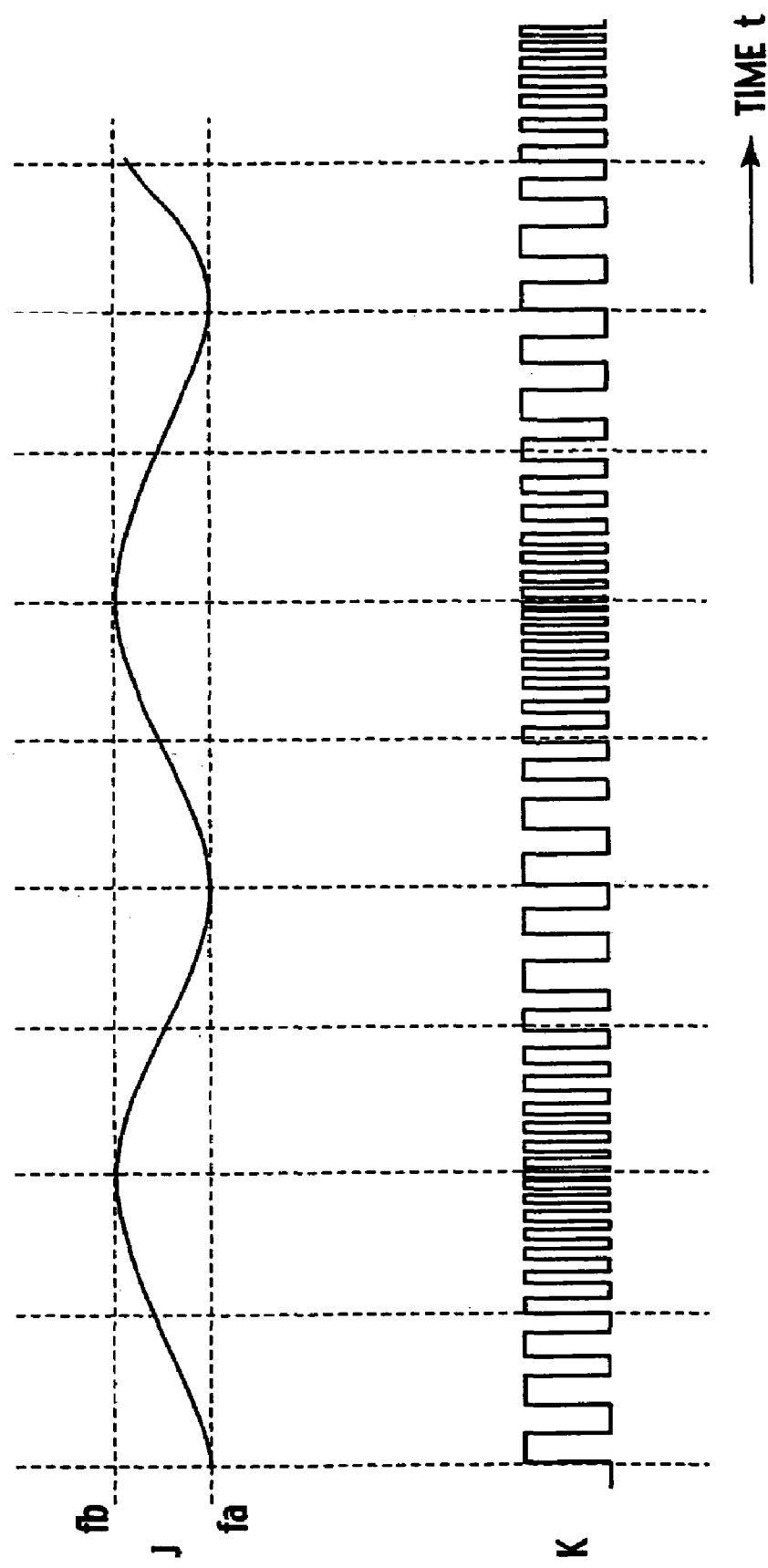
FIG. 2 shows voltage waveforms for explaining a noise spectrum component diffusing method of a stepping motor drive current pulse train (control clock), using the general current controlled-stepping motor.
Figure 3:
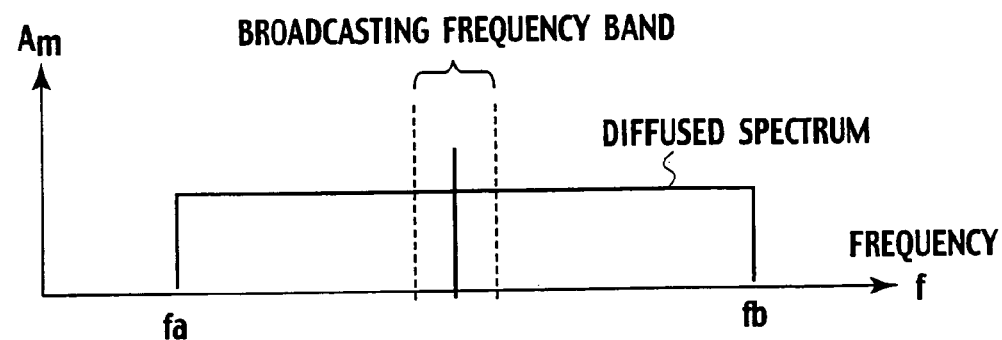
FIG. 3 shows a spectrum of the diffused noise, using the general current controlled-stepping motor.

Then, as shown in FIG. 2, a frequency modulation is implemented using the following i) and ii): i) a frequency lower than the reference control frequency of the control clock of the stepping motor 20, and ii) a sinusoidal wave J of a voltage, with an amplitude corresponding to a frequency fa to a frequency fb after the frequency modulation. Then, a variation is applied to the frequency of the PWM waveform-control clock. Then, as shown in FIG. 3, the variation of the spectrum of the above switching noise is so formed as to be diffused to the frequency band width (fa to fb) determined by the amplitude of the sinusoidal wave J, thereby reducing noise level in the radio hearing, resulting in reduction of noise influence on the radio hearing.

First Embodiment

Figure 4:
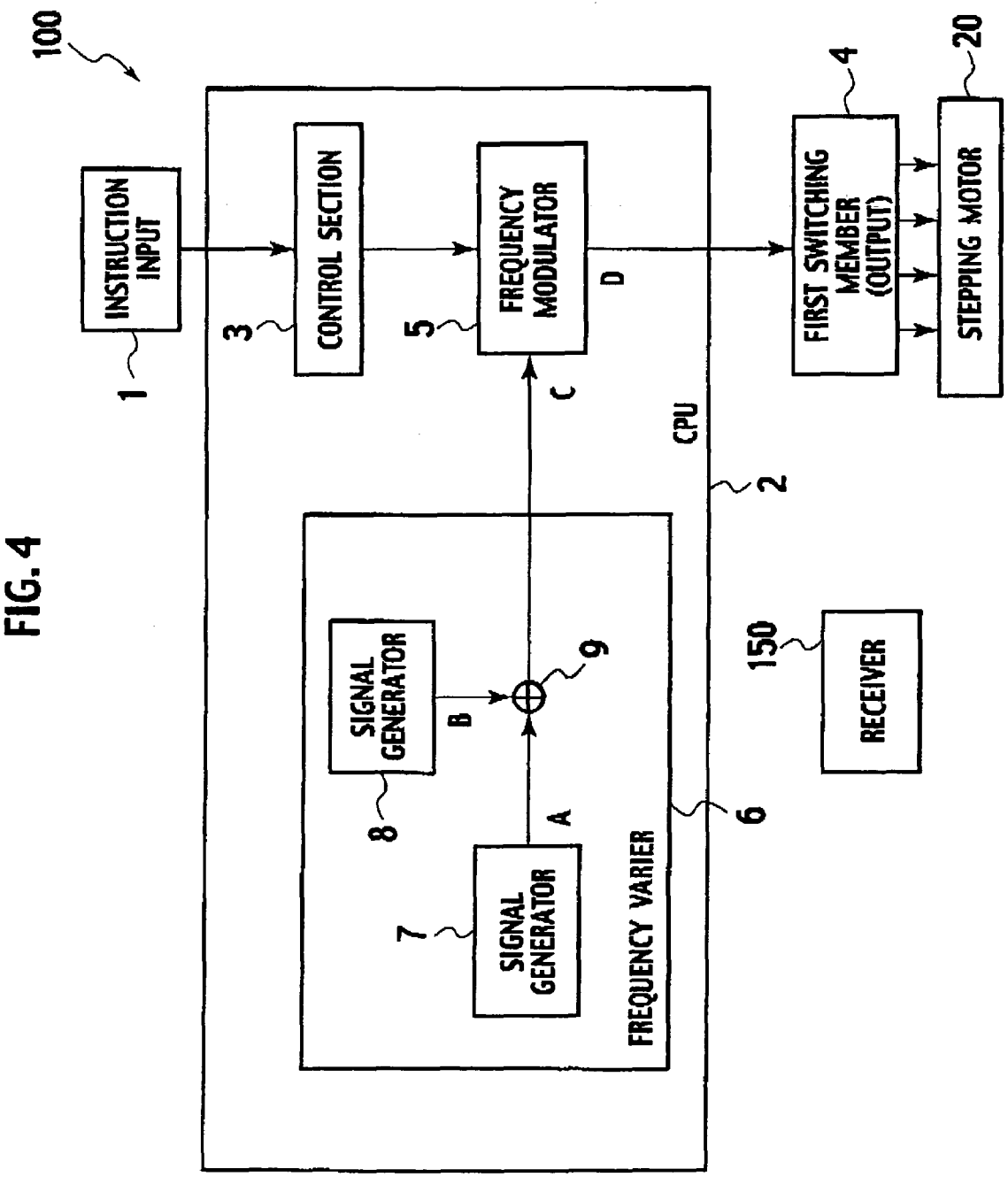
FIG. 4 shows a structure of a controller of a current controlled-stepping motor, according to a first embodiment of the present invention.

FIG. 4 shows a structure of a controller 100 of the current controlled-stepping motor 20, according to a first embodiment of the present invention. In the controller 100, inputting an instruction from the instruction input 1 to the control section 3 of the CPU 2 allows a first switching member 4 to form the pulse train (hereinafter, as the case may be, referred to as "control clock") and the sequence, where the control clock controls ON and OFF of the current flowing in a driving coil (not shown) of the stepping motor 20. Herein, the instruction inputted to the control section 3 includes a target position, an operation pattern and the like of the stepping motor 20. On the other hand, the control section 3 memorizes a present position of the stepping motor 20. The above data set an energizing sequence to the driving coil (not shown), namely, the PWM waveform-control clock.

Allowing a frequency modulator 5 to frequency-modulate the control clock at a frequency lower than that of the control clock diffuses the spectrum of the switching noise. The frequency modulator 5 incorporates a VCO (Voltage Controlled Oscillator), allowing the signal from a frequency varier 6 to supply the PWM waveform-control clock to the first switching member 4.

Figure 5:
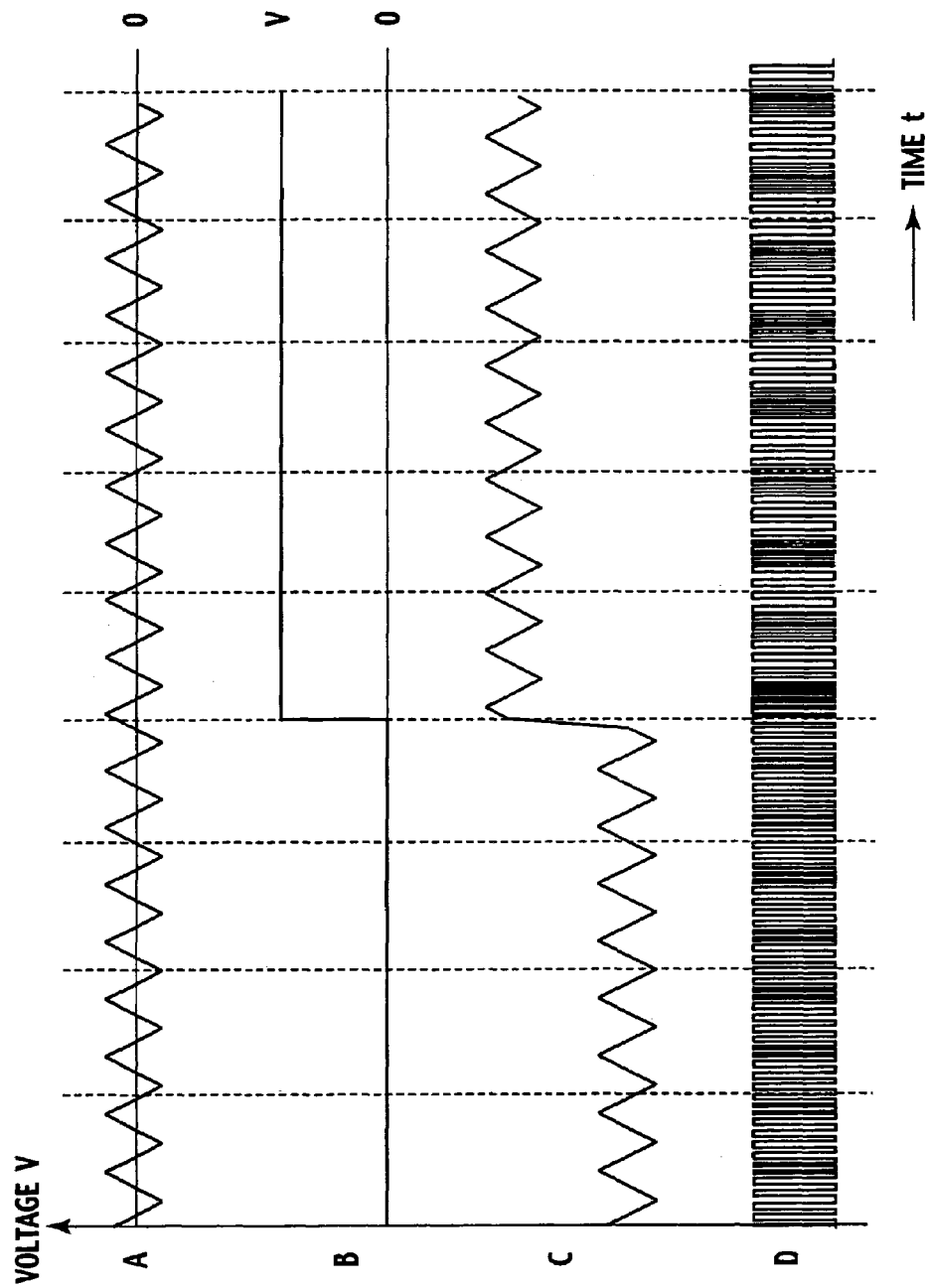
FIG. 5 shows voltage waveforms of parts of the controller of the current controlled-stepping motor in FIG. 4, according to the first embodiment of the present invention.

FIG. 5 shows voltage waveforms of respective positions A, B, C and D in FIG. 4. A denotes an output voltage waveform of a signal generator 7, setting the frequency band which diffuses the spectrum of the switching noise in the driving of the stepping motor 20. Not limited to the sinusoidal wave J, the voltage waveform A can be in the shape of a triangle wave, as show in FIG. 5.

The sinusoidal wave J is likely to have concentrated high frequency pulse components of the frequency modulation wave in the vicinity of a positive apex or a negative apex, causing more noise spectrum components. On the contrary, the triangle wave can keep uniformity of frequency changes, which is advantageous in terms of signal-to-noise ratio. For a like reason, the triangle wave may be replaced with a sawtooth wave.

In FIG. 5, B denotes an output voltage waveform of a signal generator 8 which causes an offset voltage waveform for offsetting an oscillation frequency band of the frequency modulator 5. The offset voltage waveform is preferred to change rapidly stepwise for removing remaining noise in a process of offsetting. The voltage waveform A and the voltage waveform B are added by means of an adder 9, forming an input voltage waveform C of the frequency modulator 5. The input voltage waveform C corresponds to a variation which is added, by means of the VCO of the frequency modulator 5, to the frequency of the stepping motor control pulse. An offset voltage V of the input voltage waveform C corresponds to a scale of the frequency band offset. A voltage waveform D shows the control clock which is frequency-modulated, is supplied to the first switching member 4, and drives the stepping motor 20.

Figure 6:
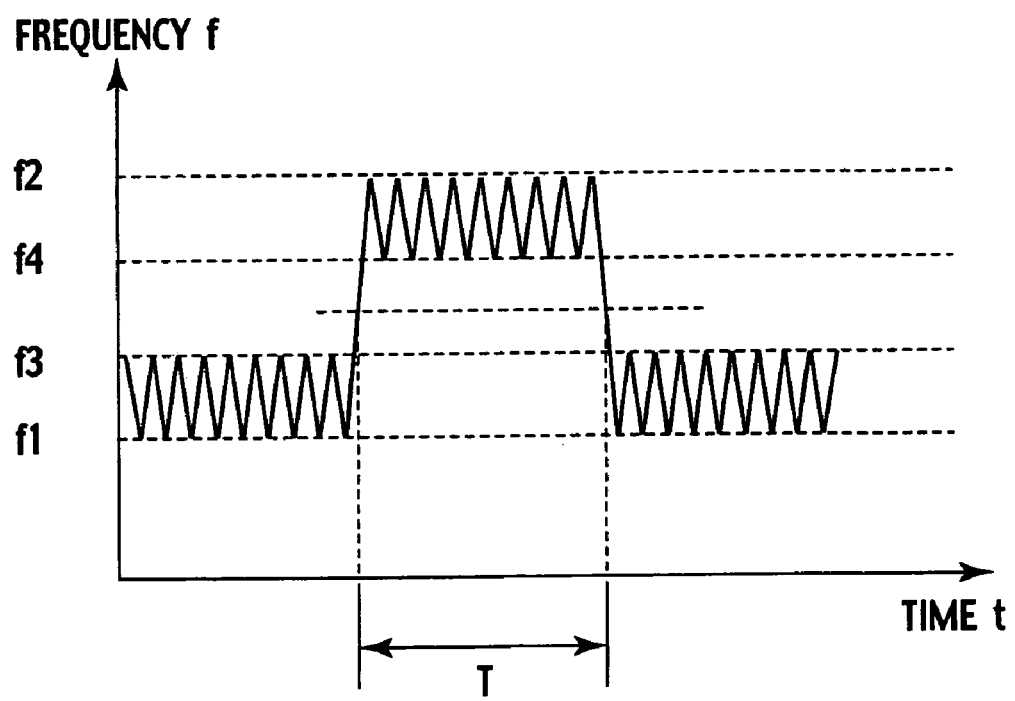
FIG. 6 shows a control signal voltage waveform before frequency modulation, under the present invention.

FIG. 6 shows a waveform of an output signal of the frequency varier 6, having a longitudinal axis denoting frequency and a horizontal axis denoting time. A voltage amplitude of the signal generator 7 corresponds to a frequency offset width (f1 to f3) and to a frequency offset width (f4 to f2), while a voltage amplitude of the signal generator 8 corresponds to a frequency offset width (f3 to f4). In FIG. 6, a time width T (denotes an energizing time when the offset voltage is applied. The time width T (or a switching period T) is to be described more in detail afterward.

Figure 7:
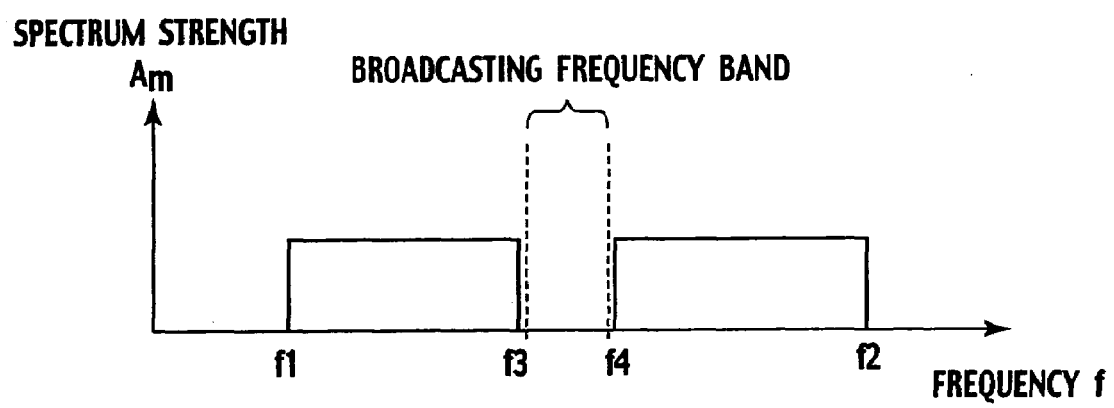
FIG. 7 shows a spectrum of stepping motor driving waveform after the frequency modulation, under the present invention.

In addition, FIG. 7 shows a spectrum of the signal supplied to the first switching member 4 when the control frequency in FIG. 4 is frequency-modulated in the waveform in FIG. 6. In FIG. 7, a longitudinal axis Am denotes a strength of the spectrum component (spectrum strength), while a horizontal axis denotes a frequency f. Frequency-modulating the control clock from the control section 3 in the waveform in FIG. 6 can form a spectrum blank (which is free of noise spectrum component) in the frequency band of f3 to f4 of the diffused noise spectrum, to thereby form an emission noise spectrum from which the noise spectrum component in the broadcasting frequency band is removed.

Second Embodiment

Figure 8:
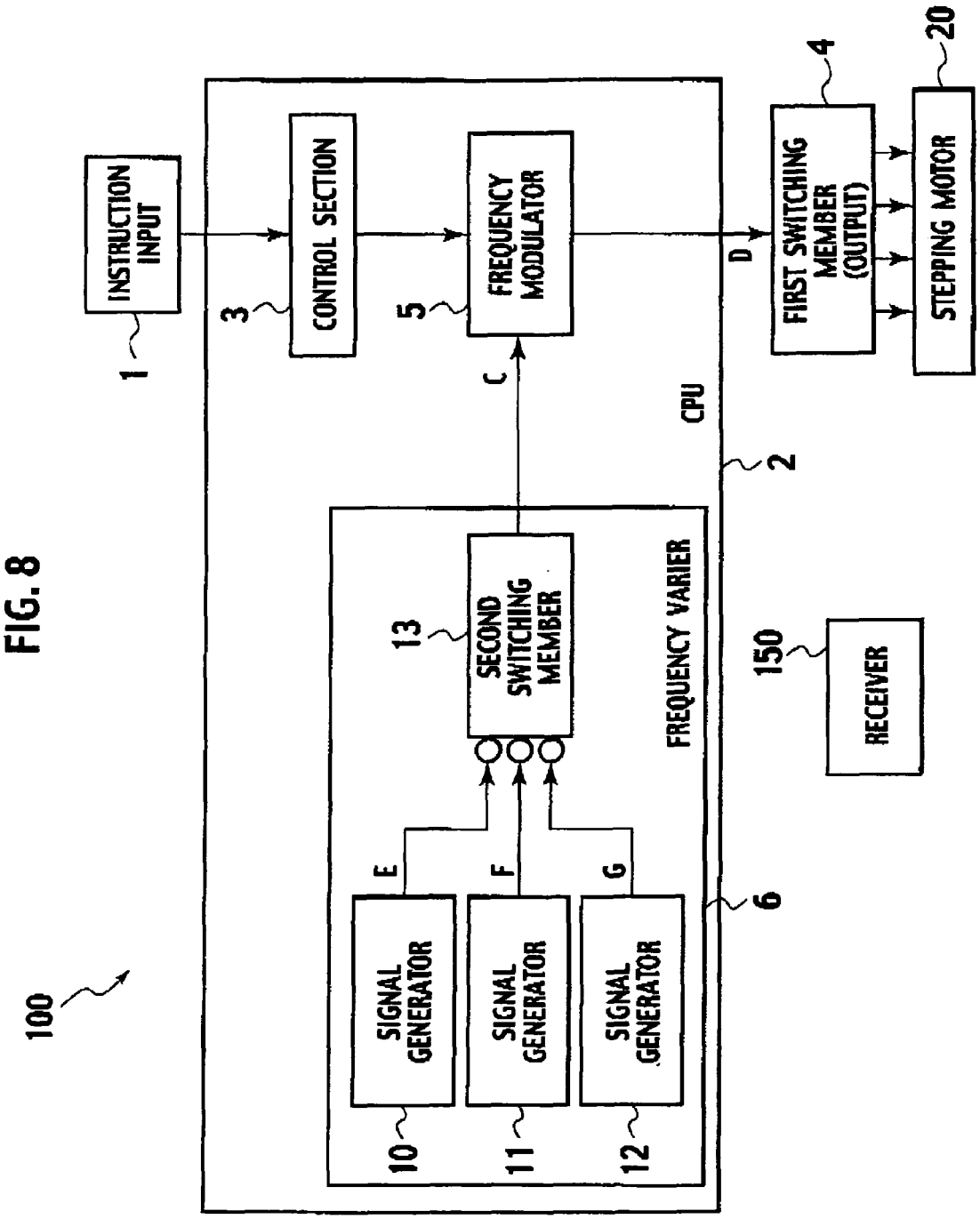
FIG. 8 shows a structure of the controller of the current controlled-stepping motor, according to a second embodiment of the present invention.

FIG. 8 shows a structure of the controller 100 of the current controlled-stepping motor 20, according to a second embodiment of the present invention.

In FIG. 8, the frequency varier 6 is provided with a plurality of signal generators 10, 11 having different voltage amplitudes and oscillation frequencies (offset voltages), specifically, a signal generator 10 and a signal generator 11. The frequency varier 6 is so structured that an output of a signal generator 12 switches the signal generator 10 and the signal generator 11 by means of a second switching member 13 at a predetermined period. Specifically, the signal generator 10 oscillates the frequency width (f1 to f3) while the signal generator 11 oscillates the frequency width (f4 to f2) with different offsets. Then, the frequency width (f1 to f3) and the frequency width (f4 to f2) are switched by means of the second switching member 13 at the period predetermined by the output of the signal generator 12. With this, the VCO of the frequency modulator 5 is so controlled as to prevent the high harmonic component of the stepping motor drive current pulse train from being dropped in the broadcasting frequency band (f3 to f4) in FIG. 7.

Figure 9:
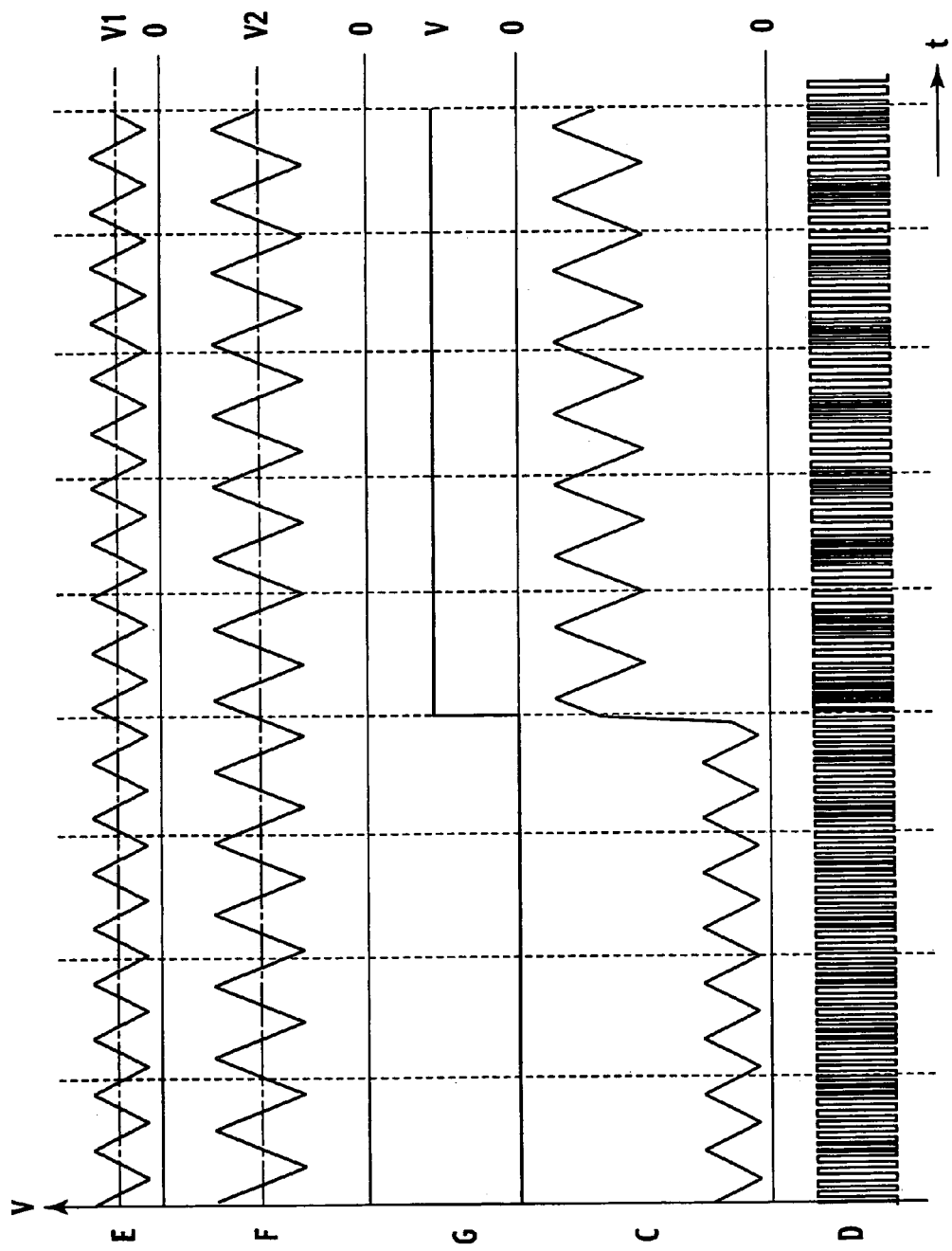
FIG. 9 shows voltage waveforms of parts of the controller of the current controlled-stepping motor in FIG. 8, according to the second embodiment of the present invention.

FIG. 9 shows voltage waveforms of respective positions E, F, G, C and D in FIG. 8. E denotes an output voltage waveform of the signal generator 10, F denotes an output voltage waveform of the signal generator 11, having the amplitude and the offset voltage different from those of the voltage waveform E. G denotes an output voltage waveform of the signal generator 12, showing a timing for the second switching member 13 to implement switching operations. When the voltage waveform G has a low potential (voltage V1), the signal generator 10 is selected; while when the voltage waveform G has a high potential (voltage V2), the signal generator 11 is selected. C denotes an input voltage waveform supplied from the frequency varier 6 to the frequency modulator 5. The input voltage waveform C corresponds to a variation which is added, by means of the VCO of the frequency modulator 5, to the frequency of the stepping motor control pulse. The voltage waveform D shows the control clock which is frequency-modulated, is supplied to the first switching member 4, and drives the stepping motor 20.

According to the second embodiment showing a plurality of emission noise spectrums having different spectrum widths, strengths of respective spectrums, namely, strengths of the spectrum widths of the f1 to f3 and f4 to f2 can be orderly arranged. The frequency spectrum is like that shown in FIG. 7.

Third Embodiment

Figure 10:
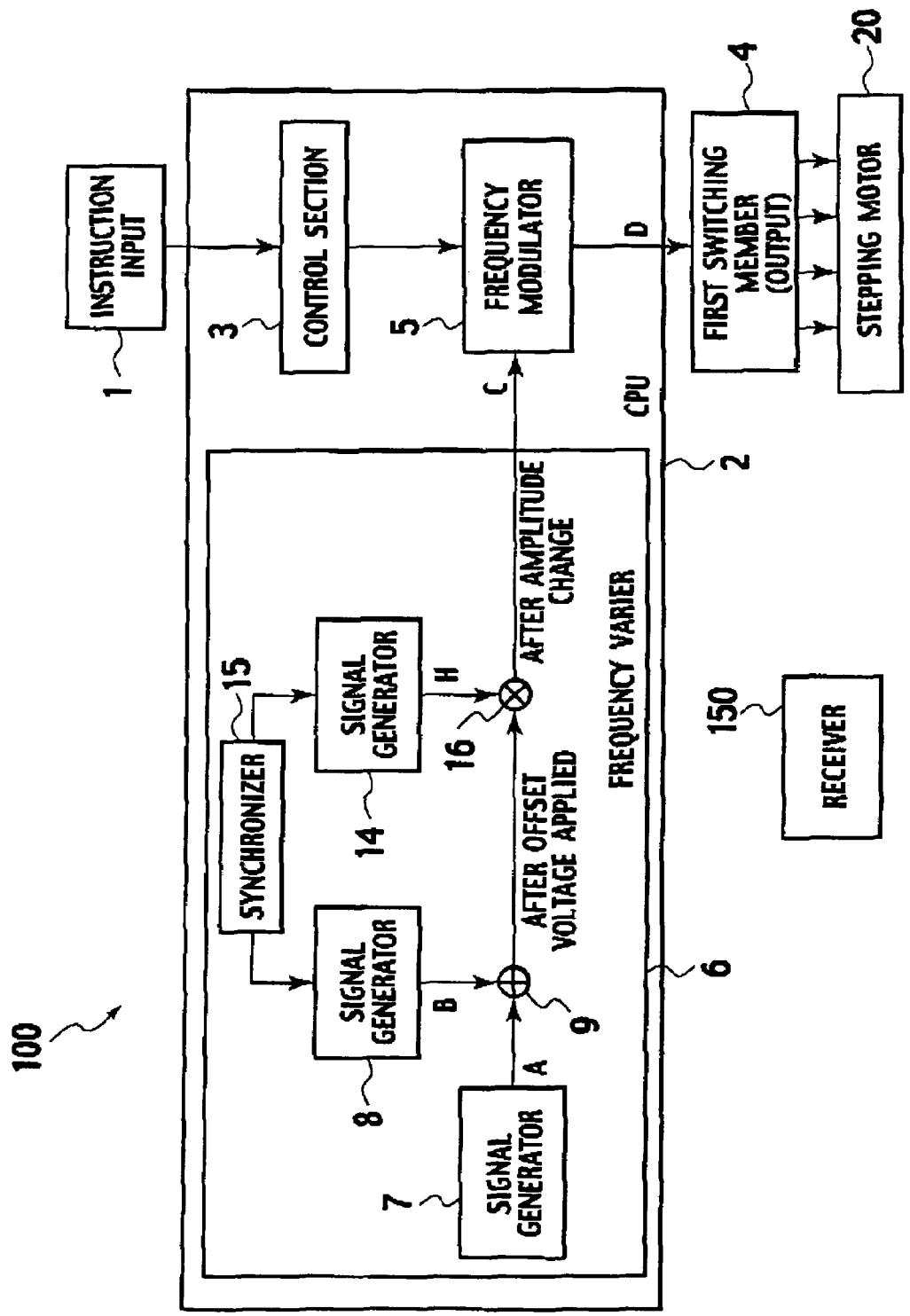
FIG. 10 shows a structure of the controller of the current controlled-stepping motor, according to a third embodiment of the present invention.

FIG. 10 shows a structure of the controller 100 of the current controlled-stepping motor 20, according to a third embodiment of the present invention.

The frequency varier 6 is provided with the signal generator 7, the signal generator 8 changing an offset of an output of the signal generator 7, and a signal generator 14 changing an amplitude of the thus obtained voltage waveform. In addition, the signal generator 8 and the signal generator 14, in combination, are provided with a synchronizer 15 for synchronizing changes in the output voltages of the signal generator 8 and the signal generator 14.

With the above structure, the signal generator 8 and the signal generator 14 can, at a constant period, form voltage waveforms having different amplitudes and offsets. Specifically, in a frequency band corresponding to an offset of the signal generator 8, a blank can be formed in a diffused emission noise spectrum, thereby diffusing the emission noise spectrum in a frequency band corresponding to an amplitude which is set by the signal generator 14.

Figure 11:
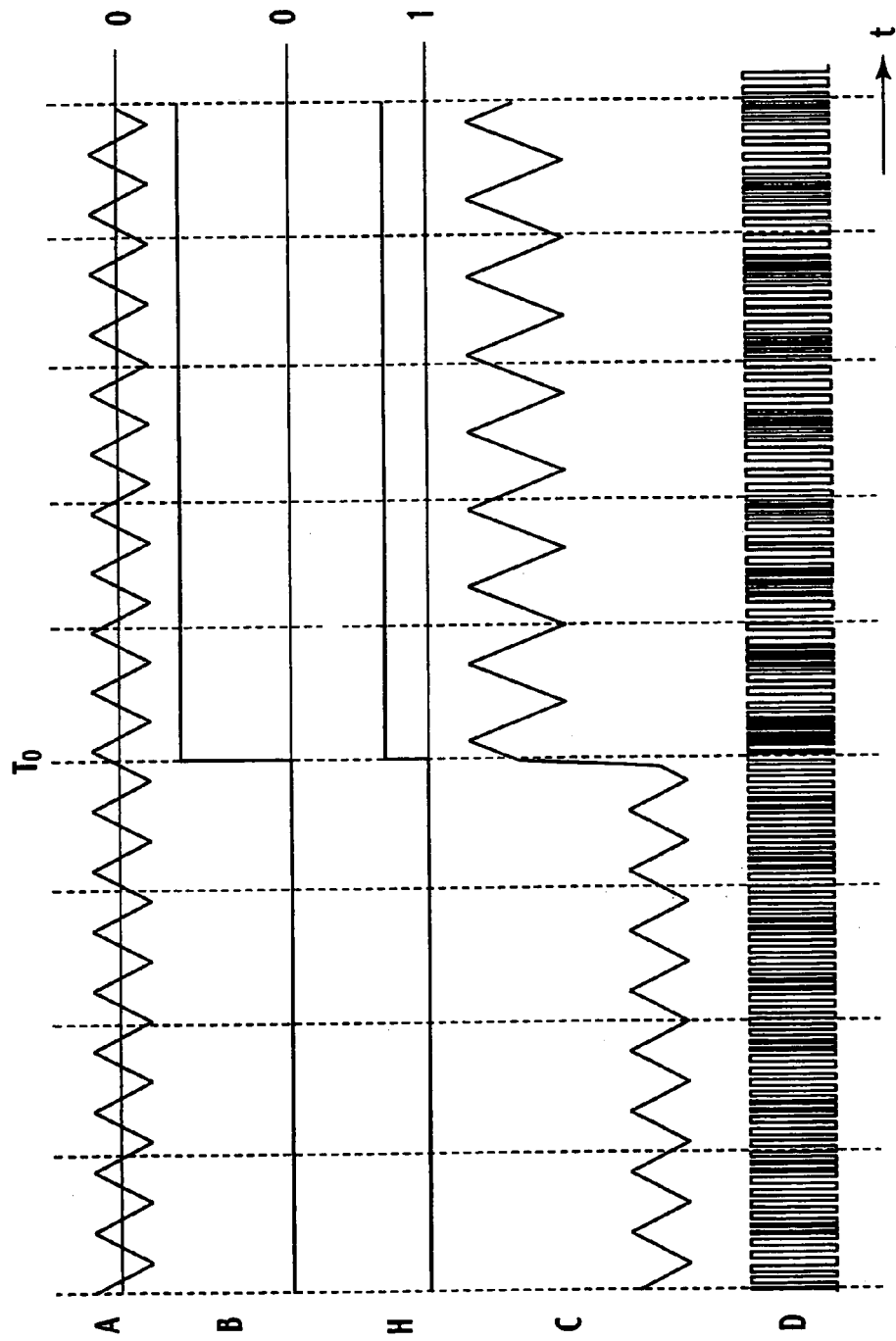
FIG. 11 shows voltage waveforms of parts of the controller of the current controlled-stepping motor in FIG. 10, according to the third embodiment of the present invention.

FIG. 11 shows voltage waveforms of respective positions A, B, H, C and D in FIG. 10. A denotes an output voltage waveform of the signal generator 7, B denotes an output voltage waveform of the signal generator 8 changing the offset voltage of the voltage waveform A. H denotes a voltage waveform made by a multiplier 16 which changes an amplitude of an output (A+B) of the adder 9. Herein, the synchronizer 15 synchronizes amplitude changing timings at time To of the voltage waveform B and of the voltage waveform H. C denotes the voltage waveform supplied from the frequency varier 6 to the frequency modulator 5. The voltage waveform D shows the control clock which is frequency-modulated, is supplied to the first switching member 4, and drives the stepping motor 20.

The adder 9 adds the voltage waveform A to the voltage waveform B, adding the offsets. The multiplier 16 multiplies i) the voltage waveform after this offset addition with ii) the voltage waveform H from the signal generator 14, to thereby form the input voltage waveform C. In the frequency modulator 5, i) the input voltage waveform C in combination with ii) the control clock corresponding to the instruction from the control section 3 bring about the drive current pulse train D which drives the first switching member 4. The frequency spectrum is like that shown in FIG. 7.

Fourth Embodiment

Figure 12:
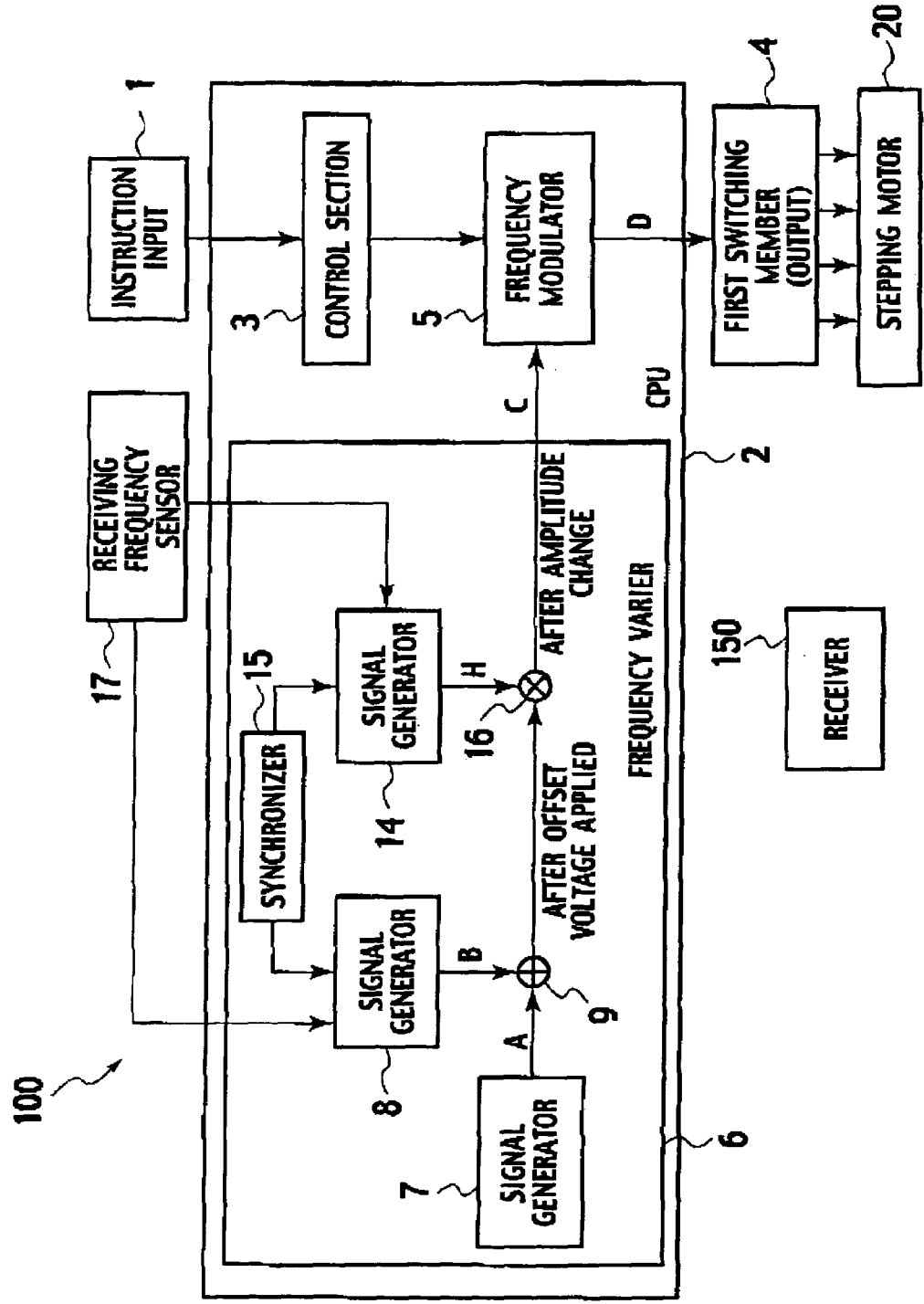
FIG. 12 shows a structure of the controller of the current controlled-stepping motor, according to a fourth embodiment of the present invention.

FIG. 12 shows a structure of the controller 100 of the current controlled-stepping motor 20, according to a fourth embodiment of the present invention.

According to the fourth embodiment in FIG. 12, in addition to the structure according to the third embodiment in FIG. 10, there is provided a receiving frequency sensor 17 for sensing a receiving frequency of a radio receiver 150. Corresponding to the receiving frequency, oscillating conditions of the signal generator 8 and the signal generator 14 are controlled, thereby changing offsets and amplitudes of the output of the frequency varier 6. The receiving frequency of the radio receiver 150 is sensed by a method of once sweeping a broadcasting frequency range, otherwise, the signal generator 8 and the signal generator 14 can be controlled by a communication frequency map which was prepared in advance for each region.

Figure 13:
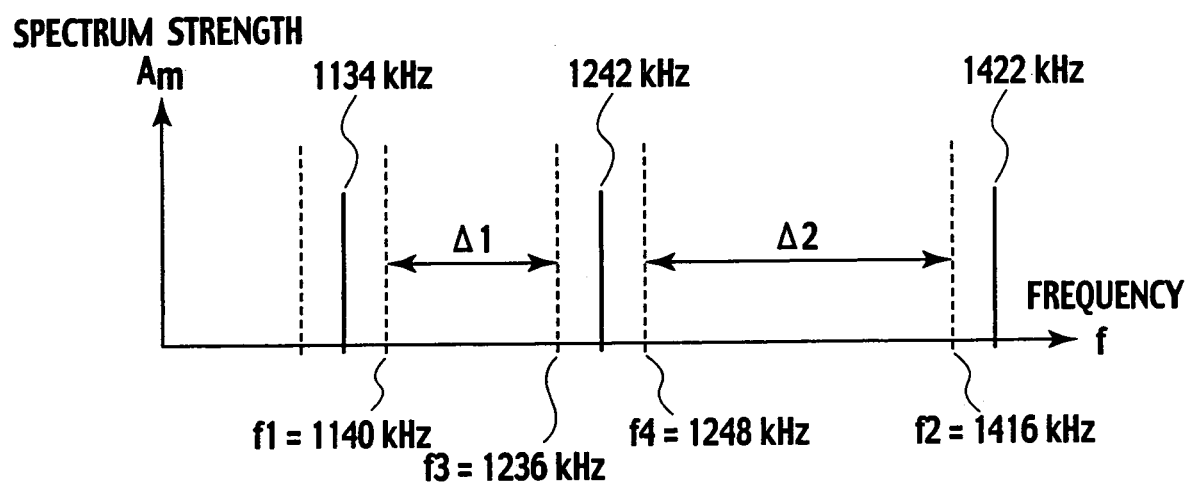
FIG. 13 shows frequency band distributions of broadcasting waves of three broadcasting offices.

Hereinafter described is an AM radio as a specific example. At a reference control frequency of 248 kHz for driving the stepping motor 20, the receiving frequency sensor 17 senses receiving frequencies of Nippon Cultural Broadcasting Inc. broadcast (1,134 kHz), Nippon Broadcasting System, Inc. (1,242 kHz) and Radio Nippon Co. LTD. (1,422 kHz). In this case, five-multiple high harmonic (1,240 kHz=248 kHz×5) of the reference control frequency (248 kHz) may influence the broadcasting frequency band of Nippon Broadcasting System, Inc. FIG. 13 shows frequency band distributions of broadcasting waves of the above three broadcasting offices.

At first, i) between Nippon Cultural Broadcasting Inc. and Nippon Broadcasting System, Inc., and ii) between Nippon Broadcasting System, Inc. and Radio Nippon Co. LTD., the frequencies corresponding to f1, f2, f3 and f4 in FIG. 7 are to be determined. With the side band wave of 6 kHz, the following equations can be obtained:

$$f1=1,134+6=1,140 \text{ kHz}$$

$$f3=1,242-6=1,236 \text{ kHz}$$

$$f4=1,242+6=1,248 \text{ kHz}$$

$$f2=1,422-6=1,416 \text{ kHz}$$

With the reference control frequency of the stepping motor drive clock of 248 kHz, its five-multiple high harmonic (248 kHz×5=1,240 kHz) is included in the frequency band of Nippon Broadcasting System, Inc. of f3 to f4. Therefore, the output voltage of the signal generator 8 is so set, as an offset voltage, that this five-multiple high harmonic (1,240 kHz) is included in a blank frequency band (for example, f1 to f3 or f4 to f2) in the vicinity of f3 to f4.

Then, a frequency band ratio for switching the offset voltage is to be determined in proportion to the frequency band width which diffuses the noise spectrum. Defining the frequency band of f1 to f3 as Δ1 and the frequency band of f2 to f4 as Δ2 can bring about the following equations:

$$\Delta 1 = f3 - f1 = 96 \text{ kHz}$$

$$\Delta 2 = f2 - f4 = 168 \text{ kHz}$$

Figure 14:
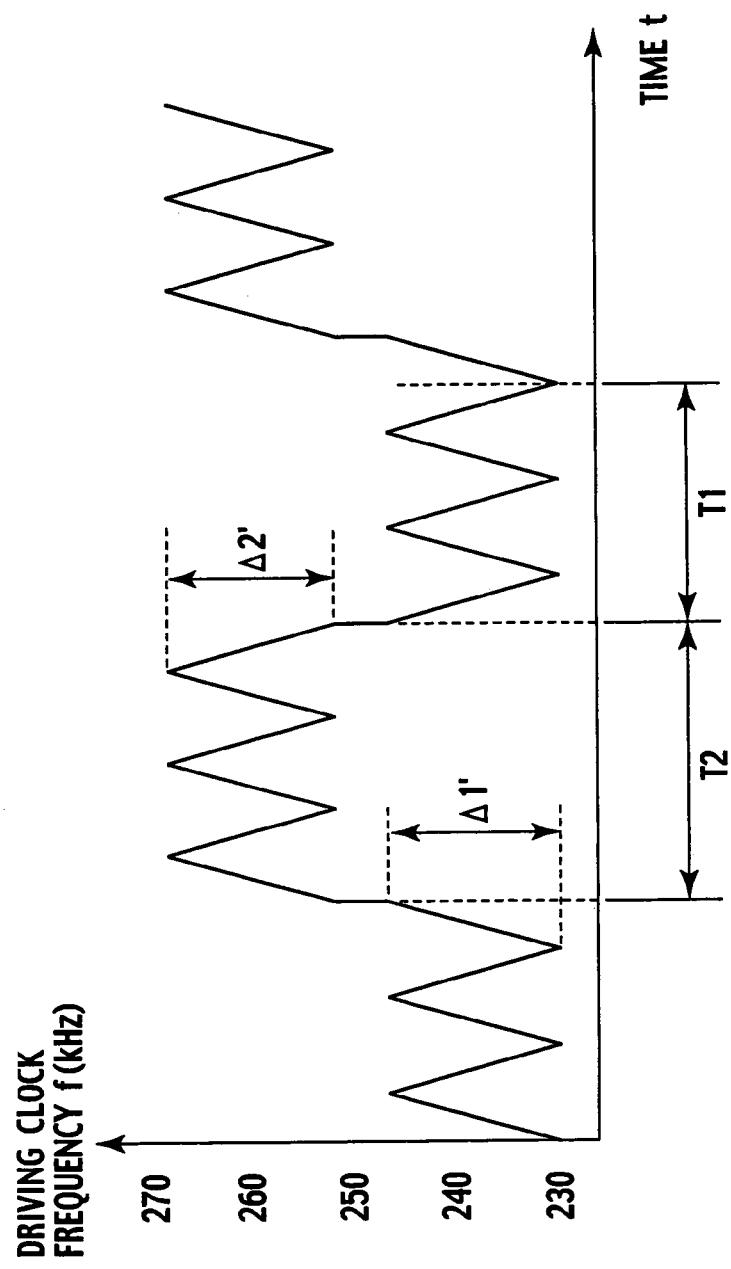
FIG. 14 shows control voltage waveforms corresponding to the frequency band distributions in FIG. 13.

Herein, when the diffused band widths are different, noise spectrum strengths become different with band widths, thereby deteriorating noise-reducing effect. For preventing the deteriorated noise-reducing effect, the energizing times (T1 and T2) which are offset per band in FIG. 14 are to meet the following equations.

$$T1 = \Delta 1'/(\Delta 1' + \Delta 2')$$

$$T2 = \Delta 2'/(\Delta 1' + \Delta 2')$$

where Δ1' and Δ2' each denote a width of a variation in the frequency of driving the stepping motor 20, as shown in FIG. 14.

Namely, repeating switching operations meeting the switching period T(T=T1+T2) can orderly arrange the noise spectrum strengths even for different band widths, thereby optimizing the energizing time width.

In the above structure, the output waveform of the frequency varier 6 is a combination of a triangle wave with a rectangular wave which switches the offset. In addition, the output waveform of the signal generator 14 which makes switching operations for changing the amplitude is preferred to be rectangle. As described above, the noise-reducing effect can be maximized for an arbitrary frequency band.

This application is based on a prior Japanese Patent Application No. P2004-323085 (filed on Nov. 8, 2004 in Japan). The entire contents of the Japanese Patent Application No. P2004-323085 from which priority is claimed are incorporated herein by reference, in order to take some protection against translation error or omitted portions.

Although the present invention has been described above by reference to the four embodiments, the present invention is not limited to the four embodiments. Modifications and variations of the embodiments described above will occur to those skilled in the art, in light of the above teachings.

Specifically, although the current controlled-stepping motor is described according to the first embodiment through the fourth embodiment of the present invention, a DC-DC converter and the like controlled with PWM signal can replace the current controlled-stepping motor.

The scope of the present invention is defined with reference to the following claims.

What is claimed is:

1. A controller of a pulse width modulation signal-driven device, comprising:
   1) an instruction input for inputting an instruction of operating the pulse width modulation signal-driven device;
   2) a control section for generating, with the instruction from the instruction input, a control clock which operates the pulse width modulation signal-driven device;
   3) a frequency modulator for frequency-modulating the control clock which is an output of the control section, to thereby give to the control clock a frequency variation in a predetermined frequency range;
   4) a frequency varier for generating a modulation signal to be inputted to the frequency modulator, the frequency varier including:
      i) a first signal generator for setting a range of diffusing a switching noise in a frequency range, the switching noise being caused by a switching element, and
      ii) a unit for shifting a frequency band of the switching noise by giving a predetermined offset voltage to a first output voltage of the first signal generator; and
   5) a first switching member for driving the switching element which flows a predetermined drive current to the pulse width modulation signal-driven device based on the frequency-modulated control clock,
   width wherein
   the frequency varier includes a plurality of the first signal generators having different amplitudes and offset voltages, and
   the unit of the frequency varier includes:
   a) a second signal generator for making an instruction for a switching, and
   b) a second switching member which switches the first output voltages of the plurality of the first signal generators at a predetermined period based on second output voltage of the second signal generator, to thereby cause the predetermined offset voltage.

2. The controller of the pulse width modulation signal-driven device as claimed in claim 1, wherein
   the pulse width modulation signal-driven device is a stepping motor.

3. The controller of the pulse width modulation signal-driven device as claimed in claim 1, wherein
   the pulse width modulation signal-driven device is a DC-DC converter.

4. A controller of a pulse width modulation signal-driven device, comprising:
   1) an instruction input for inputting an instruction of operating the pulse width modulation signal-driven device;
   2) a control section for generating, with the instruction from the instruction input, a control clock which operates the pulse width modulation signal-driven device;
   3) a frequency modulator for frequency-modulating the control clock which is an output of the control section, to thereby give to the control clock a frequency variation in a predetermined frequency range;
   4) a frequency varier for generating a modulation signal to be inputted to the frequency modulator, the frequency varier including:
      i) a first signal generator for setting a range of diffusing a switching noise in a frequency range, the switching noise being caused by a switching element, and
      ii) a unit for shifting a frequency band of the switching noise by giving a predetermined offset voltage to a first output voltage of the first signal generator; and
   5) a first switching member for driving the switching element which flows a predetermined drive current to the pulse width modulation signal-driven device based on the frequency-modulated control clock,
   wherein
   the unit of the frequency varier includes:
   a) a second signal generator, and
   b) an adder for adding a second output voltage of the second signal generator to the first output voltage of the first signal generator, to thereby cause the predetermined offset voltage,
   the frequency varier includes:
   i) a third signal generator for changing an amplitude of an output voltage which is the addition by using the adder, and
   ii) a synchronizer for synchronizing the second output voltage of the second signal generator with a third output voltage of the third signal generator,
   the controller further comprises a receiving frequency sensor,
   with the receiving frequency sensor, the second signal generator senses a receiving frequency of a receiver in a vicinity of the first switching member, and changes the offset voltage corresponding to the receiving frequency, and
   with the receiving frequency sensor, the third signal generator senses the receiving frequency of the receiver in the vicinity of the first switching member, and changes corresponding to the receiving frequency the amplitude of the output voltage which is the addition by using the adder.

5. The controller of the pulse width modulation signal-driven device as claimed in claim 4, wherein
   the first output voltage of the first signal generator is a triangle wave having a predetermined amplitude, and
   the second output voltage of the second signal generator and the third output voltage of the third signal generator each are a rectangular wave having a predetermined amplitude.

6. A method of controlling a pulse width modulation signal-driven device, comprising:
   1) inputting an instruction of operating the pulse width modulation signal-driven device;
   2) generating, with the thus inputted instruction, a control clock which operates the pulse width modulation signal-driven device;
   3) frequency-modulating the thus generated control clock, to thereby give to the control clock a frequency variation in a predetermined frequency range;
   4) generating a modulation signal to be inputted to a frequency modulator for the frequency-modulating, the generating of the modulation signal including:
      i) first signal generating for setting a range of diffusing a switching noise in a frequency range, the switching noise being caused by a switching element, and
      ii) shifting a frequency band of the switching noise by giving a predetermined offset voltage to first output voltage generated by the first signal generating; and
   5) driving the switching element which flows a predetermined drive current to the pulse width modulation signal-driven device based on the frequency-modulated control clock,
   wherein
   the generating of the modulation signal includes a plurality of the first signal generatings causing different amplitudes and offset voltages, and the shifting of the frequency band of the switching noise includes:
a) second signal generating for making an instruction for a switching, and
b) second switching which switches the first output voltages of the plurality of the first signal generatings at a predetermined period based on a second output voltage of the second signal generating, to thereby cause the predetermined offset voltage.

7. A controller of a pulse width modulation signal-driven device, comprising:
1) inputting means for inputting an instruction of operating the pulse width modulation signal-driven device;
2) controlling means for generating, with the instruction from the inputting means, a control clock which operates the pulse width modulation signal-driven device;
3) frequency-modulating means for frequency-modulating the control clock which is an output of the controlling means, to thereby give to the control clock a frequency variation in a predetermined frequency range;
4) frequency-varying means for generating a modulation signal to be inputted to the frequency-modulating means, the frequency-varying means including:
   i) first signal generating means for setting a range of diffusing a switching noise in a frequency range, the switching noise being caused by a switching element, and
   ii) shifting means for shifting a frequency band of the switching noise by giving a predetermined offset voltage to a first output voltage of the first signal generating means; and
5) first switching means for driving the switching element which flows a predetermined drive current to the pulse width modulation signal-driven device based on the frequency-modulated control clock, wherein
the frequency varying means includes a plurality of the first signal generating means having different amplitudes and first offset voltages, and
the shifting means of the frequency varying means includes:
a) second signal generating means for making an instruction for a switching, and
b) second switching means which switches the first output voltages of the plurality of the first signal generating means at a predetermined period based on a second output voltage of the second signal generating means, to thereby cause the predetermined offset voltage.

* * * * *